(12) United States Patent
Ikeda

(10) Patent No.: US 7,015,524 B2
(45) Date of Patent: Mar. 21, 2006

(54) METHOD OF ETCHING MAGNETIC MATERIAL, MAGNETORESISTIVE FILM AND MAGNETIC RANDOM ACCESS MEMORY

(75) Inventor: Takashi Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/924,796

(22) Filed: Aug. 25, 2004

(65) Prior Publication Data

US 2005/0048675 A1    Mar. 3, 2005

(30) Foreign Application Priority Data

Aug. 29, 2003   (JP)   ............... 2003-306418

(51) Int. Cl.
H01L 29/76    (2006.01)
H01L 29/94    (2006.01)
H01L 31/062   (2006.01)
H01L 31/113   (2006.01)
H01L 31/119   (2006.01)

(52) U.S. Cl. .................... 257/295; 257/421
(58) Field of Classification Search ............... 257/295, 257/296, 421
See application file for complete search history.

(56) References Cited

U.S. PATENT DOCUMENTS

| | | | | |
|---|---|---|---|---|
| 6,219,275 B1 * | 4/2001 | Nishimura | ........ | 365/173 |
| 6,391,216 B1 | 5/2002 | Nakatani | ........ | 216/41 |
| 6,480,411 B1 * | 11/2002 | Koganei | ........ | 365/158 |
| 6,669,807 B1 | 12/2003 | Nakatani | ........ | 156/345.1 |
| 6,713,830 B1 * | 3/2004 | Nishimura et al. | ........ | 257/421 |
| 6,743,340 B1 * | 6/2004 | Fu | ........ | 204/192.12 |
| 2004/0167997 A1 | 8/2004 | Ikeda | ........ | 710/15 |

FOREIGN PATENT DOCUMENTS

| | | |
|---|---|---|
| JP | 11-92970 | 4/1999 |
| JP | 11-213650 | 8/1999 |
| JP | 2003-78184 | 3/2003 |

* cited by examiner

Primary Examiner—David Nhu
(74) Attorney, Agent, or Firm—Fitzpatrick, Cella, Harper & Scinto

(57) ABSTRACT

A spin tunneling magnetoresistive film 110, which comprises a first magnetic film 111, a tunnel film 112 and a second magnetic film 113, is formed on a substrate 101, and on the top surface of the spin tunneling magnetoresistive film 110 a resist film 102 having a desired shape is formed. The magnetic films 111, 113 are each an alloy film of a rare earth metal-transition metal. The spin tunneling magnetoresistive film 110 is plasma etched by using a mixed gas of carbon monoxide gas and ammonia gas. A sidewall substance 103 adhering to a side surface of the spin tunneling magnetoresistive film 110 is oxidized or nitrided by performing plasma etching by use of oxygen gas or nitrogen gas.

3 Claims, 3 Drawing Sheets

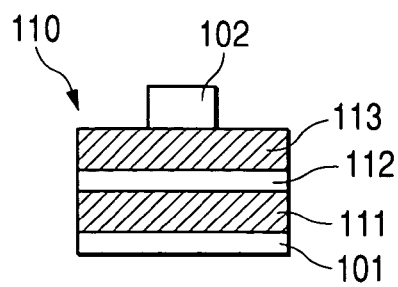
FIG. 1A
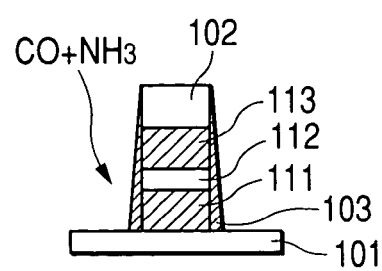
FIG. 1B
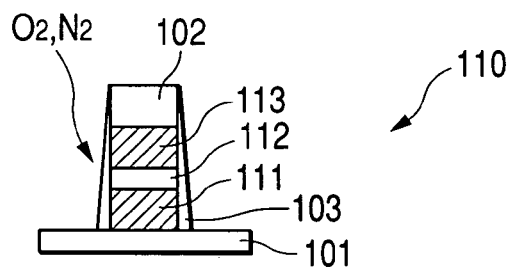
FIG. 1C
FIG. 2
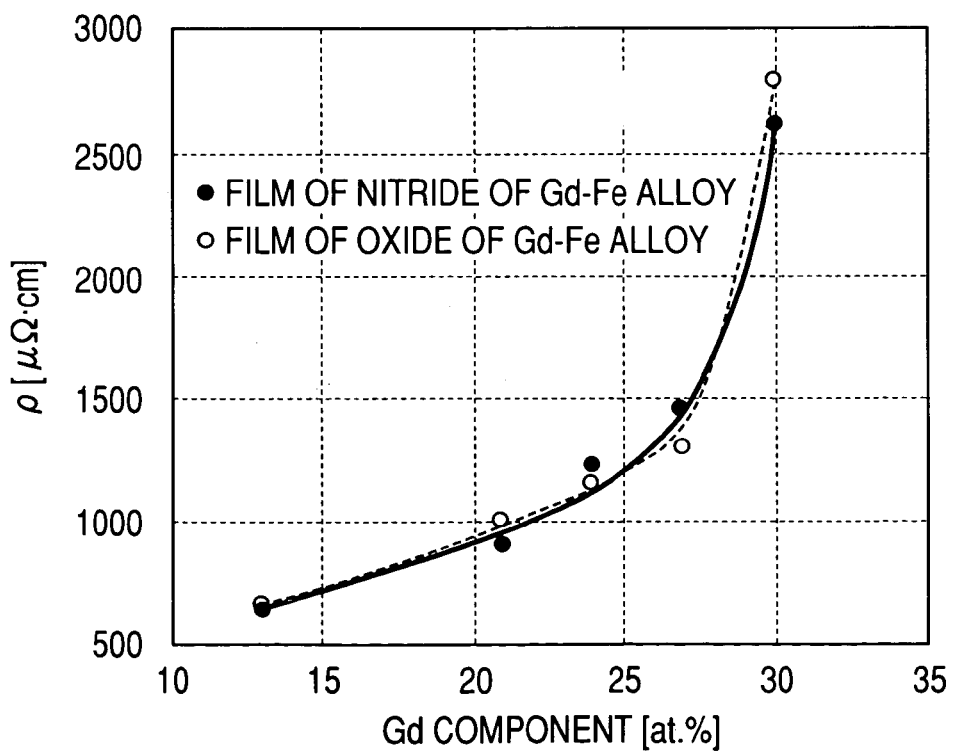

(PRIOR ART)

METHOD OF ETCHING MAGNETIC MATERIAL, MAGNETORESISTIVE FILM AND MAGNETIC RANDOM ACCESS MEMORY

BACKGROUND OF THE INVENTION

1. Field of the Invention

The present invention relates to a method of etching a magnetic material and the like and, more particularly, to a method of etching a spin tunneling magnetoresistive film and the like.

2. Related Background Art

In recent years, MRAM (Magnetic Random Access Memory) which is a high speed nonvolatile memory has been attracting attention as a memory which replaces many solid memories which are at present in use. In particular, MRAM which utilizes the spin tunneling magnetoresistive effect is favorable for high recording density design or high speed read because large read signals are obtained, and the possibility as MRAM has been demonstrated in recent study reports.

The basic structure of a magnetoresistive film used as an element of MRAM is a sandwich structure in which magnetic layers are formed in an adjacent manner via a non-magnetic layer. However, when the element size is reduced in order to increase the recording density of MRAM, MRAM which uses an in-plane magnetized film cannot retain information due to the effects of a diamagnetic field or the curling of the magnetization of an end surface, thus posing a problem. This problem can be avoided, for example, by forming a magnetic layer in the shape of a rectangle. Under the method, however, the element size cannot be reduced and hence a great improvement in recording density cannot be expected.

Therefore, as described in the Japanese Patent Application Laid-Open No. 11-213650 (U.S. Pat. No. 6,219,275), for example, a suggestion has been advanced that the above-described problem is to be eliminated by using a perpendicular magnetized film. According to this technique, a diamagnetic field does not increase even when the element size decreases and, therefore, it is possible to realize a magnetoresistive film having a size smaller than that of MRAM which uses an in-plane magnetized film.

An amorphous alloy film of a rare earth metal and a transition metal is advantageously used as a perpendicular magnetized film used in MRAM. For example, Gd and Tb can be used as a rare earth metal and Fe and Co can be used as a transition metal.

Usually, in the MRAM fabrication process, a selective transistor is first formed on a Si wafer. After that, a film of a TMR element is formed on the whole area of the Si wafer and a memory element is fabricated by the microfabrication of the multilayer film.

In the semiconductor process, reactive etching is used during fabrication. Reactive etching is an etching process which involves holding a workpiece, for example, a Si wafer in a vacuum chamber and converting Si into $SiF_4$ etc. by causing a reactive gas such as $F_2$ to react with Si in a plasma, thereby removing Si. In reactive etching, the etching rate is high, a removed substance will not adhere again to a side wall of the workpiece, and microfabrication is possible.

However, in the etching of MRAM which uses a magnetoresistive film in which a magnetic film contains a substance having a higher melting point than Si, it is difficult to prevent a removed substance from adhering again to a workpiece. For example, in a case where a TMR element which uses a rare earth metal-transition metal alloy film is etched, for example, by using Ar, which is an inert gas, as shown in FIG. 6, a sidewall substance 103 which comprises a rare earth metal-transition metal alloy adheres again to a worked sidewall of a TMR element, which comprises a first magnetic film 111 formed on a substrate 101, a tunnel insulating film 112 and a second magnetic film 113. In a magnetoresistive film in which a current is caused to flow in a direction perpendicular to the film plane, the first magnetic film and the second magnetic film short electrically due to the formation of a sidewall substance on a sidewall of the electromagnetic film, and it becomes impossible to obtain the magnetoresistive effect.

As a method for solving this problem, as described in the Japanese Patent Application Laid-Open No. 2003-78184, there has been proposed a method which involves changing a sidewall substance into another sidewall substance having high electrical resistance by using $N_2$ or a mixed gas of an inert gas and $N_2$ as an etching gas. For example, as shown in the graph of FIG. 2(a) of Japanese Patent Application Laid-Open No. 2003-78184, in a case where a TMR element which uses a rare earth metal-transition metal alloy film is etched by using an inert gas alone and worked to a size of 20 $\mu m \times 20$ $\mu m$, the resistance value was tens of ohms. However, the resistance value can be increased to tens of kilo-ohms by using $N_2$ gas.

It is necessary to reduce the cell area in order to increase the recording density of MRAM. In a magnetoresistive film in which a current is caused to flow in a direction perpendicular to the film plane, the resistance value of a memory element is proportional to the area. That is, if the area of an element of 20 $\mu m \times 20$ $\mu m$ is reduced to, for example, 20 nm×20 nm, then the resistance value is expected to increase to $10^6$ times. At this time, unless a sidewall substance has sufficiently high resistance, a current which flows via the sidewall substance increases in association with the scale down of the element and a sufficient magnetoresistive effect cannot be expected.

Furthermore, when the film thickness of a magnetic film is relatively large, the thickness of a sidewall substance adhering to a side surface of the magnetic film also increases. For this reason, also in this case, a current flowing via the sidewall substance increases similarly and it is feared that a sufficient magnetoresistive effect could not be obtained.

Therefore, the present invention has as its object the provision of a method of etching a magnetic material in such a manner as to suppress a current flowing via a sidewall substance to a greater extent, and the like.

SUMMARY OF THE INVENTION

To achieve the above-described object, a method of a magnetic material of the present invention is a method of etching a magnetic material which contains a rare earth metal and a transition metal as main component elements, which has the step of reducing a component ratio of the transition metal to the rare earth metal of a sidewall substance, which adheres to the magnetic material when the magnetic material is etched, to a value smaller than a component ratio of the transition metal to the rare earth metal in the magnetic material.

By thus reducing a component ratio of the transition metal to the rare earth metal in a sidewall substance to a value smaller than a component ratio of the transition metal to the rare earth metal in the magnetic material, it is possible to increase the electric resistivity of the sidewall substance to a value larger than that of the magnetic material. For this reason, it is possible to reduce a current flowing via the sidewall substance adhering to the magnetic material.

The above-described step may include performing the dry etching of the above-described magnetic material by using a mixed gas of carbon dioxide gas and ammonia gas. According to an etching method which uses a mixed gas of carbon monoxide gas and ammonia gas, on the surface of the magnetic material which contains a transition metal as a main component element there is formed a carbonyllic transition metal and this carbonyllic transition metal is removed by the evaporation action in a vacuum or the sputter action by ions. Therefore, it is possible to cause the sidewall substance to have a low content of the transition metal component or scarcely contain the transition metal.

Furthermore, the above-described step may have the step of oxidizing the above-described sidewall substance by using oxygen gas or may have the step of nitriding the above-described sidewall substance by using nitrogen gas. By oxidizing or nitriding the sidewall substance by these steps, the sidewall substance can be made an insulator.

The above-described magnetic material may constitute the above-described magnetic film of a magnetoresistive film, which is formed by the laminating of a magnetic film and a nonmagnetic film. By etching the magnetic material constituting the magnetic film by the above-described etching method of the present invention, it is possible to reduce a leak current flowing via a sidewall substance which adheres to the magnetoresistive film and it becomes possible to form a magnetoresistive film form which a sufficient magnetoresistive effect can be obtained.

The above-described magnetoresistive film may be a tunnel insulating film.

A magnetoresistive film of the present invention is a magnetoresistive film including a structure which has at least a first magnetic layer, a second magnetic layer and a nonmagnetic layer disposed between the magnetic layers, in which the above-described first and second magnetic layers contain a rare earth metal and a transition metal, and a component ratio of the transition metal to the rare earth metal contained in a sidewall substance formed on a side wall of the above-described first and second magnetic layers and the above-described nonmagnetic layer is smaller than a component ratio of the transition metal to the rare earth metal in the above-described first and second magnetic layers.

The above-described sidewall substance comprises an oxide or a nitride of the above-described rare earth metal or an oxide or a nitride of the above-described rare earth metal and transition metal.

A magnetic random access memory of the present invention is constructed so as to form the above-described magnetoresistive film of the invention in matrix shape on a substrate and performs recording and reading of information by using the magnetoresistive film as a memory element.

BRIEF DESCRIPTION OF THE DRAWINGS

FIGS. 1A, 1B and 1C are each a schematic representation of one embodiment of a method of etching a magnetic material according to the invention;

FIG. 2 is a graph which shows the relationship between the component ratio of a rare earth metal (Gd) and electric resistivity of rare earth metal-transition metal alloy films;

DESCRIPTION OF THE PREFERRED EMBODIMENTS

Figure 3A:
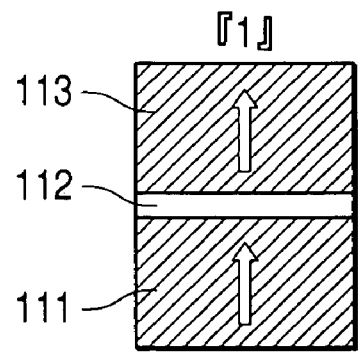
FIGS. 3A and 3B are each a drawing which shows the relationship between the magnetization direction of a spin tunneling film and "1" and "0" of digital information.

FIGS. 1A, 1B and 1C schematically show one embodiment of a method of etching a magnetic material according to the invention.

First, as shown in FIG. 1A, a spin tunneling magnetoresistive film 110 comprising a first magnetic film 111, a tunnel insulating film 112 and a second magnetic film 113 is formed on a substrate 101, and a resist film 102 having a desired shape is formed on the spin tunneling magnetoresistive film. The magnetic films 111, 113 contain a substance having a higher melting point than Si and are an alloy film formed from a magnetic material which contains, for example, a rare earth metal element and a transition metal as main component elements. The tunnel film 112 is formed from, for example, aluminum oxide.

This spin tunneling magnetoresistive film 110 is held in a vacuum chamber (not shown) and the interior of this chamber is thoroughly evacuated. After that, a mixed gas of carbon monoxide gas (CO) and ammonia gas ($NH_3$) is introduced into the chamber and dry etching is performed by using a plasma of this mixed gas.

According to an etching method which uses a mixed gas of CO gas and $NH_3$ gas, as described, for example, in the paragraph (0007) of Japanese Patent Application Laid-Open No. 11-92970, on the surface of a magnetic material which contains a transition metal element as a main component there is formed a carbonylated product of the transition metal due to an active radical of CO, and etching is performed because this carbonylated product of the transition metal is removed by the evaporation action in a vacuum or the sputter action by ions. At this time, $NH_3$ gas has the property of delaying the disproportionation reaction of CO gas, it is possible to cause the transition metal and CO to react sufficiently with each other.

FIG. 1B shows the condition of the spin tunneling magnetoresistive film 110 shown in FIG. 1A which is etched to the shape of the resist film 102 by the above-described plasma etching method. After the etching of the TMR element by the above-described plasma etching method, a sidewall substance 103 adheres to a side surface of the TMR element 110 as shown in FIG. 1B. The sidewall substance is formed on the side surfaces of part of the first and second magnetic films and the tunnel film of the TMR element.

However, according to the etching method which uses a plasma of a mixed gas of CO gas and $NH_3$ gas, as described above, on the surface of a magnetic material which contains a transition metal element as a main component there is formed a carbonylated product of the transition metal and this carbonylated product of the transition metal is removed by the evaporation action in a vacuum or the sputter action by ions. Therefore, it is possible to cause the sidewall substance to have a low content of the transition metal component or scarcely contain the transition metal. In other words, according to the above-described plasma etching, when the spin tunneling magnetoresistive film 110 including the magnetic films 111, 113 formed from a magnetic material is etched, it is possible to reduce a component ratio of the transition metal to the rare earth metal of a sidewall substance, which adheres to the sidewall of the TMR element 110, to a value smaller than a component ratio of the transition metal to the rare earth metal in the magnetic films 111, 113.

Lastly, as shown in FIG. 1C, the sidewall substance 103 is subjected to oxidation treatment by introducing $O_2$ gas or a mixed gas of an inert gas, such as Ar, and $O_2$ gas into the vacuum chamber.

Next, a description will be given below about results of an examination which was carried out to get to know how the electric resistivity of components of the sidewall substance 103 adhering to a side surface of the TMR element 110 changes due to the oxidation treatment of the components.

First, results of an examination of Gd and Tb, which are rare earth metal elements, will be described. Because as described above, the magnetic films 111, 113 are formed from an alloy containing a rare earth metal element and a transition metal element, the earth metal element and the transition metal element can adhere to a side surface of the tunnel insulating film. However, because the transition element is removed according to the above-described plasma etching method, the transition metal component of the sidewall substance 103 decreases. Therefore, these rare earth metal elements become main components of the sidewall substance 103.

In this examination, after a thin film of Gd or Tb was formed with a thickness of 3 nm on a Si substrate, the thin film was subjected to oxidation treatment by performing plasma oxidation using $O_2$ gas. The electric resistivity of each thin film was measured. In both films, the value showed hundreds of kilo-ohms·cm.

Furthermore, by supposing a case where a transition metal element remains in the sidewall substance 103, the electric resistivity p was measured for a film of oxide of Gd—Fe alloy and a film of nitride of Gd—Fe alloy, which are rare earth metal-transition metal alloy films. The measurement was carried out for these alloy films formed with a thickness of 3 nm on a Si substrate.

FIG. 2 is a graph which shows the relationship between the component ratio of a rare earth metal (Gd) and electric resistivity of rare earth metal-transition metal alloy films. As a result of measurement, it became apparent that as shown in FIG. 2, the higher the component ratio of a rare earth metal (Gd), in other words, the higher the ratio of the Fe component, which is a transition metal, the higher the electric resistivity ρ. This tendency was observed also in the case of a Tb—Fe alloy film, which is similarly a rare earth metal-transition metal alloy film.

Furthermore, the electric resistivity was measured for aluminum oxide ($AlO_x$) which comes from the composition of the tunnel insulating film 112 and can be present in the sidewall substance 103. The measurement was carried out for an $AlO_x$ film formed with a thickness of 3 nm on a Si substrate. The electric resistivity of the $AlO_x$ film was tens of micro-ohms·cm.

As described above, an oxide of a rare earth metal, an oxide of a rare earth metal-transition metal alloy and aluminum oxide can be present in the sidewall substance 103. Among others, an oxide of a rare earth metal and aluminum oxide have a relatively large electric resistivity as described above. Furthermore, even when an oxide of a rare earth metal-transition metal alloy is present in the sidewall substance 103, by reducing the proportion of a transition metal component, it is ensured that the proportion of a rare earth metal (Gd) component is high and that the electric resistivity is relatively large.

In contrast to this, the electric resistivity is about 1 mΩ·cm in a sidewall substance obtained by the plasma etching method using nitrogen gas as an etching gas, which is described in the Japanese Patent Application Laid-Open No. 2003-78184. This value is smaller than the order of each of the electric resistivity values described above.

That is, it is apparent that the sidewall substance 103 obtained after plasma etching by a mixed gas of CO gas and $NH_3$ gas has a higher electric resistivity than the sidewall substance obtained by the plasma etching method which uses $N_2$ gas as an etching gas, which is described in the Japanese Patent Application Laid-Open No. 2003-78184. This is because the proportion of the transition metal in the sidewall substance described in the Japanese Patent Application Laid-Open No. 2003-78184 is higher than in the present invention. Therefore, in the etching method of this embodiment, it is possible to reduce a leak current flowing via the deposit adhering to a side surface of the TMR element.

Incidentally, although the etching of the spin tunneling magnetoresistive film 110 comprising the first magnetic film 111, the tunnel film 112 and the second magnetic film 113 was described above, it is possible to apply the above-described etching method also to a case where only the magnetic film 111 or 113, which is formed from a magnetic material, is etched.

Next, embodiments of the present invention will be described below.

First Embodiment

As shown in FIG. 1A, a perpendicular magnetized film of $Gd_{20}(Fe_{50}Co_{50})_{80}$ was formed as a first magnetic film 111 by sputtering with a thickness of 10 nm on a substrate 101 formed from a Si wafer and an Al film was then continuously formed by sputtering with a thickness of 1.5 nm. After that, by the plasma oxidation of the Al film in an $O_2$ atmosphere, an oxidized Al film was formed as a tunnel insulating film 112, which is an insulating film. Subsequently, a perpendicular magnetized film of $Tb_{19}(Fe_{50}Co_{50})_{81}$ was formed, as a second magnetic film 113, with a thickness of 10 nm on the tunnel insulating film 112. Furthermore, a Pt film was formed, as a protective film (not shown), with a thickness of 5 nm on the second magnetic film 113.

Furthermore, a resist film 102 having a size of 180 nm×180 nm was formed on the TMR element 110 obtained as described above and the interior of a vacuum chamber (not shown) was evacuated, with this TMR element 110 held in the vacuum chamber. And a mixed gas of CO and $NH_3$ was introduced into the vacuum chamber and the TMR element 110 was dry etched to the surface of the substrate 101. After that, the interior of the vacuum chamber was thoroughly evacuated and the oxidation treatment of a sidewall substance 103 was then performed by introducing $O_2$.

The resistance value of the TMR element fabricated as described above was about 95 kΩ and the magnetoresistance ratio of this TMR element was about 21%.

Second Embodiment

In the same manner as in the first embodiment, a perpendicular magnetized film of $Gd_{20}(Fe_{50}Co_{50})_{80}$ having a thickness of 10 nm as a first magnetic film 111, a tunnel insulating film 112 which is an insulating film formed from an oxidized Al film with a thickness of 1.5 nm, a perpendicular magnetized film of $Tb_{19}(Fe_{50}Co_{50})_{81}$ with a thickness of 10 nm as a second magnetic film 113, and a Pt film with a thickness of 5 nm as a protective film (not shown) were sequentially formed on a substrate 101 formed from a Si wafer, and a TMR element of the same film structure as the first embodiment was formed.

Furthermore, a resist film 102 having a size of 180 nm×180 nm was formed on the TMR element 110 obtained as described above and the interior of a vacuum chamber (not shown) was evacuated, with this TMR element 110 held in the vacuum chamber. And a mixed gas of CO and $NH_3$ was introduced into the vacuum chamber and the TMR element 110 was dry etched to the surface of the substrate 101. After that, the interior of the vacuum chamber was thoroughly evacuated and the oxidation treatment of a sidewall substance 103 was then performed by introducing $N_2$.

The resistance value of the TMR element fabricated as described above was about 90 kΩ and the magnetoresistance ratio of this TMR element was about 19%.

Third Embodiment

In this embodiment, a description will be given about an example in which MRAM uses a magnetoresistive film in which the composition ratio of a transition metal to a rare earth metal of a side wall substance formed on sidewalls of a magnetic layer and a nonmagnetic layer is smaller than the composition ratio of a transition metal to a rare earth metal in the magnetic layer. By correlating the magnetization direction of a magnetic film with "1" and "0" of digital information, it is possible to form a memory device from a TMR element.

Figure 3B:
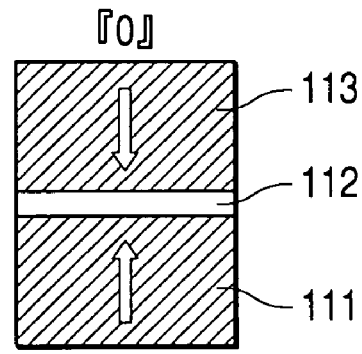

As shown in FIGS. 3A and 3B, in a TMR element in which magnetic films 111, 113 are formed above and under a tunnel insulating film 112, which is an insulating film, to as to be in contact with the tunnel insulating film 112, the resistance value when the magnetization direction of a transition metal contained in the two magnetic films 111, 113 is the same as in FIG. 3A is small compared to a case where as shown in FIG. 3B, the magnetization direction of a transition metal contained in the two magnetic films 111, 113 is a reverse direction. This difference in resistance value depends greatly on the spin polarization ratio of the two magnetic films 111, 113. The higher the spin polarization ratio, the greater the difference in resistance value, and this is desirable because output signals of a memory can be increased. In the example shown in FIGS. 3A and 3B, digital information is correlated to "1" when the magnetization direction of a transition metal contained in the two magnetic films 111, 113 is the same as in FIG. 3A, and digital information is correlated to "0" when as shown in FIG. 3B, the magnetization direction of a transition metal contained in the two magnetic films 111, 113 is a reverse direction.

For example, an alloy of Fe and Co can be mentioned as a magnetic material having a high spin polarization ratio. However, in an ordinary state an alloy film of Fe and Co does not become a perpendicular magnetized film. Therefore, in order to direct the magnetization direction to a direction perpendicular to the film plane, it is necessary to take measures of some kind, such as applying a magnetic field to a direction perpendicular to the film plane of the alloy film.

Figure 4:
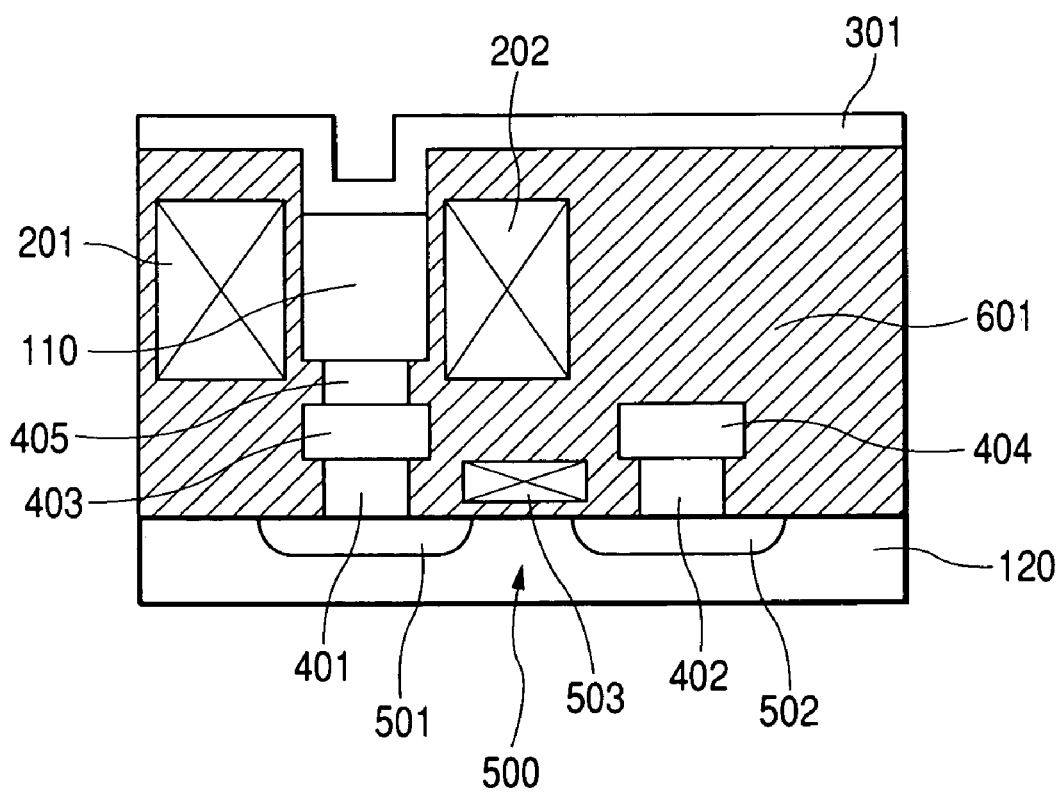
FIG. 4 is a schematic representation of part of a memory device fabricated from a spin tunneling magnetoresistive film formed according to the invention.

FIG. 4 is a schematic representation of part of a memory device fabricated from a TMR element formed according to the invention.

The memory device shown in FIG. 4 has an NMOS transistor 500 which has n-type diffusion areas 501, 502 formed on a p-type Si wafer 120 and a gate electrode 503 formed between the two n-type diffusion areas 501, 502. It is advisable that that this switch transistor for element selection be formed by the CMOS process at the same time with the formation of a peripheral circuit. Contact plugs 401, 403, 405 are formed in an electrically interconnected state on and above one 501 of the n-type diffusion areas, and contact plugs 402, 404 are formed in an electrically interconnected state on and above the other 502 of the n-type diffusion areas.

A TMR element 110 is formed on the contact plug 405 on the n-type diffusion area 501. Incidentally, this TMR element 110 functions as a memory element in the memory device shown in FIG. 4.

A bit wire 301 of Al is formed on the TMR element and the reading of digital information recorded in the TMR element 110, which is a memory element, is performed via this bit wire 301.

Leads 201, 202 are arranged beside the TMR element 110 which generate recording magnetic fields in order to direct the magnetization direction of a first magnetic film 111 and the magnetization direction of a high spin polarization ratio film 115 (refer to FIG. 5) to a desired direction. The direction of a current flowing in the lead 201 and the direction of a current flowing in the lead 202 during the recording of digital information are opposite to each other, and the leads 201, 202 apply magnetic fields in the same direction to the TMR element 110. An $Al_2O_3$ film is formed as an interlayer dielectric insulating film 601 in the region between the p-type Si wafer 120 and the bit wire 301.

The TMR element 110 is formed in matrix shape, though not clearly shown in FIG. 4, and the memory device shown in FIG. 4 functions as a magnetic random access memory which performs the recording and reading of information by using the TMR element 110 as a memory element.

Figure 5:
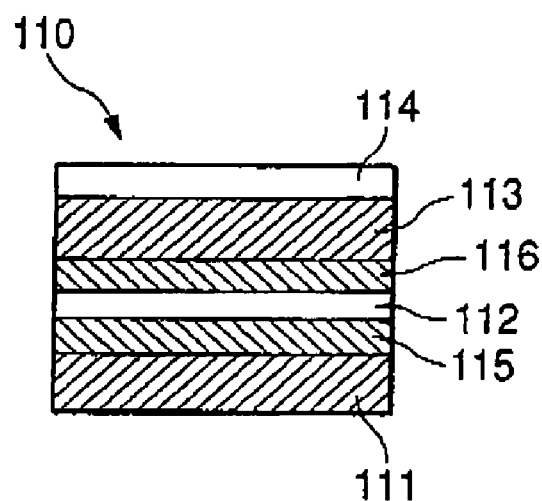
FIG. 5 is a drawing which shows the film structure of a spin tunneling magnetoresistive film which is a memory unit of the memory device shown in FIG. 4.
Figure 6:
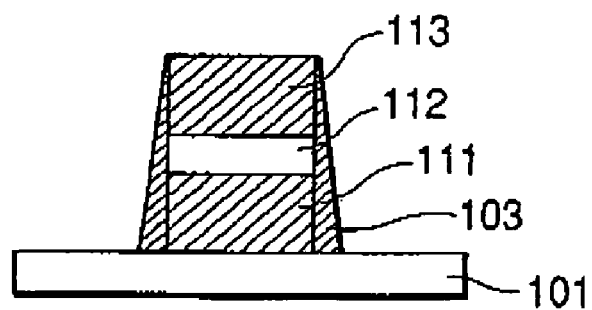
FIG. 6 is a drawing which shows the film structure of a spin tunneling magnetoresistive film fabricated by a conventional etching method.

FIG. 5 is a drawing which shows the film structure of a TMR element which is a memory element of the memory device shown in FIG. 4.

As shown in FIG. 5, a TMR element 110 is a multilayer film which is formed by the laminating of a perpendicular magnetized film of $Gd_{21}(Fe_{50}Co_{50})_{79}$ with a thickness of 50 nm, which is a first magnetic film 111, a first high spin polarization rate film 115 of $Fe_{50}Co_{50}$ with a thickness of 0.5 nm, a tunnel insulating film 112 formed from an Al oxidized film with a thickness of 1.3 nm, a second high spin polarization rate film 116 with a thickness of 0.5 nm, a perpendicular magnetized film of $Tb_{20}(Fe_{50}Co_{50})_{80}$ with a thickness of 30 nm, which is a second magnetic film 113, and a Pt film with a thickness of 5 nm, which is a protective film 114.

The first magnetic film 111 and the first high spin polarization rate film 115 are exchange coupled, and the magnetization direction of the first high spin polarization rate film 115 is parallel to the magnetization direction of a transition metal sublattice of the first magnetic film 111. Also, the second magnetic film 113 and the second high spin polarization rate film 116 are exchange coupled, and the magnetization direction of the second high spin polarization rate film 116 is parallel to the magnetization direction of a transition metal sublattice of the second magnetic film 113. The first and second magnetic films 111, 113 can reverse their magnetization direction when a magnetic field is applied, and particularly, the first magnetic film 111 can reverse its magnetization direction with a magnetic filed which is smaller than a magnetic field applied to the second magnetic film 113. The TMR element can be advantageously fabricated by the methods of the first and second examples. However, the present invention is not limited to these two methods, and other fabrication methods may be adopted so long as fabrication is performed in such a manner that the component ratio of a transition metal to a rare earth metal of a sidewall substance, which is formed on a sidewall of a magnetic layer and a nonmagnetic layer, is lower than the component ratio of a transition metal to a rare earth metal in the magnetic layer.

COMPARATIVE EXAMPLE

In the same manner as in the first embodiment which was described with reference to FIGS. 1A to 1C, a perpendicular magnetized film of $Gd_{20}(Fe_{50}Co_{50})_{80}$ was formed as a first magnetic film 111 by sputtering with a thickness of 10 nm on a substrate 101 formed from a Si wafer and an Al film was then continuously formed by sputtering with a thickness of 1.5 nm. After that, by the plasma oxidation of the Al film in an $O_2$ atmosphere, an oxidized Al film was formed as a tunnel insulating film 112, which is an insulating film. Subsequently, a perpendicular magnetized film of $Tb_{19}(Fe_{50}Co_{50})_{81}$ was formed, as a second magnetic film 113, with a thickness of 10 nm on the tunnel insulating film 112. Furthermore, a Pt film was formed, as a protective film (not shown), with a thickness of 5 nm on the second magnetic film 113.

Furthermore, a resist film 102 having a size of 180 nm×180 nm was formed on the TMR element 110 obtained as described above and the interior of a vacuum chamber (not shown) was evacuated, with this TMR element 110 held in the vacuum chamber. And a mixed gas of Ar and $N_2$ was introduced into the vacuum chamber and the TMR element 110 was dry etched to the surface of the substrate 101.

The resistance value of the TMR element fabricated as described above was about 40 kΩ and the magnetoresistance ratio of this TMR element was about 3%. This resistance value is less than half the resistance values of the magnetoresistive elements in the first and second examples. Also, this magnetoresistance ratio is about 1/7 of the magnetoresistance ratios of the magnetoresistive elements in the first and second examples.

Incidentally, in the embodiments, the descriptions were limited to the TMR elements. However, the present invention is not limited to the TMR elements. In an element which exhibits magnetic resistance by causing a current to flow in a direction perpendicular to the film plane (a current-perpendicular-to-plane element: CPP element), an electrode to cause a current to flow is not provided on a side surface of the magnetic film and, therefore, this CPP element is advantageously used.

This application claims priority from Japanese Patent Application No. 2003-306418 filed Aug. 29, 2003, which is hereby incorporated by reference herein.

What is claimed is:

1. A magnetoresistive film including a structure which has at least a first magnetic layer and a second magnetic layer and a nonmagnetic layer disposed between the magnetic layers, in which said first and second magnetic layers contain a rare earth metal and a transition metal, and a component ratio of the transition metal to the rare earth metal contained in a sidewall substance fanned on a side wall of said first and second magnetic layers and said nonmagnetic layer is smaller than a component ratio of the transition metal to the rare earth metal in said first and second magnetic layers.

2. The magnetoresistive film according to claim 1, wherein said sidewall substance comprises an oxide or a nitride of said rare earth metal or an oxide or a nitride of said rare earth metal and said transition metal.

3. A magnetic random access memory in which the magnetoresistive film according to claim 1 is formed in matrix shape on a substrate and which performs recording and reading of information by using said magnetoresistive film as a memory element.

* * * * *